United States Patent [19]

Bartmann et al.

[11] Patent Number: 4,980,268
[45] Date of Patent: Dec. 25, 1990

[54] NEGATIVE PHOTORESISTS OF THE POLYIMIDE TYPE CONTAINING 1,2-DISULFONES

[75] Inventors: Ekkehard Bartmann, Erzhausen; Rudolf Klug, Aschaffenburg; Reinhard Schulz, Reinheim; Hartmut Härtner, Mühltal, all of Fed. Rep. of Germany

[73] Assignee: Ciba-Geigy Corporation, Ardsley, N.Y.

[21] Appl. No.: 321,432

[22] Filed: Mar. 9, 1989

[30] Foreign Application Priority Data

Mar. 17, 1988 [DE] Fed. Rep. of Germany ....... 3808927

[51] Int. Cl.$^5$ .................. G03F 7/025; G03C 1/725
[52] U.S. Cl. .................... 430/283; 430/270; 430/281; 430/330; 430/921; 430/927; 522/59
[58] Field of Search ............... 430/283, 281, 270, 921, 430/330, 927; 522/59

[56] References Cited

U.S. PATENT DOCUMENTS 4,040,831  8/1977  Rubner et al.
4,329,419  5/1982  Goft et al. ........................... 430/283
4,565,767  1/1986  Kataoka et al. ..................... 430/325

FOREIGN PATENT DOCUMENTS 58-83844  5/1983  Japan.

OTHER PUBLICATIONS

Chemical Abstracts, vol. 99, 1983, p. 38 (99: 140979o).
Physical Org., vol. 78, 1973, p. 15201, 1519c.
Makromol. Chem., Rapid Commun. 4, 539–541 (1983).
Light–Sensitive Systems: Chemistry and Application of Nonsilver Halide Photographic Processes, p. 167 (1974).

Primary Examiner—Paul R. Michl
Assistant Examiner—Thorl Chea
Attorney, Agent, or Firm—Harry Falber

[57] ABSTRACT

The invention relates to negative photoresists of the polyimide type essentially containing, in an organic solvent, in each case at least
(a) one polyamide-acid or polyamide-acid derivative prepolymer which can be converted into a highly heat-resistant polyimide polymer,
(b) a photoinitiator, and, if appropriate, further customary additives which contain, as the photoinitiator, a compound of the formula I $$R^1-SO_2-SO_2-R^2 \qquad I$$

in which $R^1$ and $R^2$ are as defined.

3 Claims, No Drawings

NEGATIVE PHOTORESISTS OF THE POLYIMIDE TYPE CONTAINING 1,2-DISULFONES

The invention relates to negative photoresists of the polyimide type containing 1,2-disulfone compounds as photoinitiators.

The production of semiconductor devices and integrated circuits in microelectronics is carried out virtually exclusively with the use of photolithographic structuring processes. In order to prepare microchips having specific circuit patterns, the semiconductor substrate material, which is generally silicon wafers, is coated with photoresist and photoresist relief structures are produced thereon by image-wise exposure and subsequent development. These structures serve as a mask for the actual structuring processes on the semiconductor substrate, such as etching, doping or coating with metals or other semiconductor or insulating materials. After these processes the photoresist masks are removed again, if necessary. The circuit patterns of the microchips are formed on the substrate by means of a large number of process cycles of this type.

In principle, two different types of photoresists are distinguished: In positively operating photoresists the exposed areas are dissolved away by a development process, whereas the unexposed areas remain as a layer on the substrate. In negatively operating photoresists, conversely, the irradiated areas of the layer remain as a relief structure.

The continual progress in miniaturization in semiconductor technology and microelectronics makes very high demands on the photoresist materials and the relief structures which can be prepared therewith, particular importance attaching to the sensitivity and the resolution and the contrast of the photoresist and on its adhesion, mechanical and chemical stability, dimensional accuracy and stability at elevated temperatures or other influences which can have an effect on the photoresist relief structures in the course of further process stages.

Photoresists of the polyimide type are to be understood very generally as meaning materials in which the main layer-forming components are soluble, and in some cases photopolymerizable, polyimides or polyamide-acid or polyamide-acid derivative prepolymers which can be converted into polymers of the polyimide type.

Polyimide polymers and polymers related to polyimides have, of course, a particularly marked stability to heat and chemicals. Photoresists of the polyimide type are therefore employed particularly where it is precisely these special properties that are important. Photopolymer relief structures and coatings which are highly resistant to heat can be produced by means of such materials, predominantly negatively operating materials. The main field of application is the production of microelectronic and optoelectronic circuits and devices. In this field these materials can function both as temporary photoresist masks and as permanent structures, for example insulation, protection or passivation layers, dielectric layers or, in the case of liquid-crystal display cells, as orientation layers. Polyimide materials are, for example, also very suitable for protecting semiconductor circuits against $\alpha$-radiation.

The photoresists of the polyimide type which are known and also mainly employed in industry are derived predominantly from the basic systems such as are described in German Patent Specifications Nos. 2,308,830 and 2,437,340. These contain polyamide-acid esters which have ethylenically unsaturated groups which can be crosslinked by radiation, such as, preferably, allyloxy or (meth)acryloyloxy groups. Further developments of these, as described, for example, in European Published Specification No. 47,184 and German Offenlegungsschrift No. 3,501,028, additionally contain, for the purpose of increasing the sensitivity, radiation-reactive, copolymerizable, unsaturated compounds, photosensitizers and dyes and also, in particular, more effective radical-forming photoinitiators. In every case virtually all efficient photoresist systems of the polyimide type contain photopolymerizable, unsaturated components, whether this is at least in the prepolymer itself or only by means of additional components as described, for instance, in European Published Specification No. 65,352.

The known systems are, however, still in need of improvement in many respects.

The azide photoinitiators which are often employed in these as radiation crosslinking agents, for example those of German Offenlegungsschrift No. 2,919,841, cause problems because they are thermolabile when prepared and handled. They constitute an explosion hazard and therefore require involved safety measures. It has also been found that the stability of organic azides in N-methylpyrrolidone, the solvent mainly used in photoresists of the polyimide type, is not adequate. Thus the content of azide photoinitiator in the photoresist solution decreases noticeably during storage, and this then has a corresponding adverse effect on the sensitivity of the photoresist.

The bisimidazole photoinitiators of European Published Specification No. 47,184 cannot give satisfaction in various respects. Firstly, the preferred bisimidazoles contain attached chlorine, which is undesirable in layers of polymer which are intended to remain permanently in electronic components. Secondly, relief structures having a fairly large layer thickness, for instance over 20 $\mu$m, cannot be prepared by means of the corresponding resist systems in a quality which is adequate in respect of resolution, edge sharpness and adhesion.

The titanium complex photoinitiators of European Published Specification No. 119,162 preferably contain attached fluorine, which is also disadvantageous for reasons of stability and corrosion. Furthermore, these initiators also respond to radiation of a longer wavelength higher than approx. 450 nm, so that the customary yellow safety illumination during processing is no longer adequate.

It is a serious disadvantage of all photoresist systems of the polyimide type containing, unsaturated components which can be crosslinked by radiation that a not inconsiderable proportion of the material present in the photoresist layer volatilizes during the imidation by heat required to produce a polyimide layer or relief structure which is highly heat-resistant. This relates essentially to the fractions crosslinked by radiation and originating from the polyamide prepolymer and/or the unsaturated, additional components. It is, of course, only the polyamide-acid parent compound which is subject to imidation by heat, and this then forms the essential part of the heat-treated polymer layer. The result of this is that a not inconsiderable loss in layer thickness, which frequently causes problems, takes place during the heat treatment. Contraction of the resist layer in terms of area can also result, which results in stresses to the point of layer detachment or, in the case of thin substrates of inadequate bending strength, damage of the substrate through bending.

It was required to develop negative photoresists of the polyimide type having improved properties in this respect. In particular, it was intended to find, in this connection, novel photoinitiators for photoresists of this type which do not have the disadvantages of the known photoinitiators.

It has now been found, surprisingly, that 1,2-disulfone compounds of the formula I

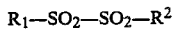

in which $R^1$ and $R^2$ can be identical or different and are alkyl, cycloalkyl, aryl, aralkyl or heteroaryl having up to 12 C atoms and being unsubstituted or monosubstituted or polysubstituted by halogen, cyano, nitro, alkyl, alkoxy, alkylthio, monoalkylamino, bisalkylamino, alkanoyl, acyloxy, acylamido, alkoxycarbonyl, alkylaminocarbonyl, alkylsulfoxy, alkylsulfonyl, aryloxy, arylthio, arylsulfoxy or arylsulfonyl each of which has up to 6 C atoms, are excellently suitable for use as photoinitiators for negative photoresists of the polyimide type. 1,2-Disulfones impart to photoresists of this type a high sensitivity in the region of approx. 200–450 nm without in addition sensitizing them in the region of the yellow safety illumination; they are also stable in these systems, they do not constitute an explosion hazard and, in addition, they normally do not contain any elements which are not compatible with the microelectronic system. It has also been found particularly unexpectedly that, if compounds of formula I are used as photoinitiators in negative photoresists of the polyimide type, photopolymerizable, unsaturated components are unnecessary in these systems.

The invention relates, therefore, to negative photoresists of the polyimide type essentially containing, in an organic solvent, in each case at least
(a) one prepolymer of a polyamide-acid or polyamide-acid derivative which can be converted into a highly heat-resistant polyimide polymer,
(b) a photoinitiator,
and, if appropriate, further customary additives, these negative photoresists containing, as the photoinitiator, a compound of the formula I

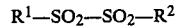

in which $R^1$ and $R^2$ can be identical or different and are alkyl, cycloalkyl, aryl, aralkyl or heteroaryl having up to 12 C atoms and being unsubstituted or monosubstituted or polysubstituted by halogen, cyano, nitro, alkyl, alkoxy, alkylthio, monoalkylamino, bisalkylamino, alkanoyl, acyloxy, acylamido, alkoxycarbonyl, alkylaminocarbonyl, alkylsulfoxy, alkylsulfonyl, aryloxy, arylthio, arylsulfoxy or arylsulfonyl each of which has up to 6 C atoms.

The invention relates in particular to negative photoresists of the polyimide type containing 1,2-disulfone compounds of the formula I as photoinitiators and containing no photopolymerizable, unsaturated components.

The invention furthermore relates to the use of compounds of the formula I as photoinitiators in negative photoresists based on prepolymers of a polyamide-acid or polyamide-acid derivative which can be converted into highly heat-resistant polyimide polymers.

The invention also relates to a process for the production of relief structures composed of highly heat-resistant polyimide polymers by coating a substrate with a negative photoresist of the polyimide type, drying the layer, exposing the layer imagewise to UV radiation of a wavelength between 200 and 450 nm, developing by dissolving away the non-irradiated portions of the layer and heat-treating the resulting relief structures, using a negative photoresist characterized as above.

The 1,2-disulfone compounds of the formula I to be employed in accordance with the invention as photoinitiators in negative photoresists of the polyimide type are for the most part known per se. It is indeed also known that a few 1,2-diaryl disulfones are reactive to radiation. Thus, for example, it is known from Bull. Chem. Soc. Jap. 45, 2906 (1972) (CA 78: 15196c) that diaryl disulfones are photoreactive and decompose into free radicals under the action of radiation. According to JP No. 58-83,844 (CA 101: 63684a), compounds of this type are employed as free-radical producers in light-sensitive compositions for photolithographic purposes. In the systems described therein, however, they are only used to initiate a colour reaction in order to produce a visual contrast between irradiated and non-irradiated areas of the layer. Further radiation-reactive compounds must be present in every case to produce photo-structures in the layer. According to Macromol. Chem., Rapid Commun. 4, 539 (1983) (CA 99: 140979v) and JP No. 59-197,422 (CA 102: 186029u), diaryl disulfones can be used as radiation crosslinking agents for acrylic polymers substituted by epoxy groups. However, it could not be deduced from this state of the art that 1,2-disulfones, particularly of a by far wider structural diversity, are excellently suitable for use as photoinitiators for negative photoresists of the polyimide type, in particular when the latter also contain no photocrosslinkable, unsaturated components at all.

In formula I the substituents $R^1$ and $R^2$ can be identical or different and are alkyl, cycloalkyl, aryl, aralkyl or heteroaryl having up to 12 C atoms and being unsubstituted or monosubstituted or polysubstituted by halogen, cyano, nitro, alkyl, alkoxy, alkylthio, monoalkylamino, bisalkylamino, alkanoyl, alkanoylacyloxy, alkanoylacylamido, alkoxycarbonyl, alkylaminocarbonyl, alkylsulfoxy, alkylsulfonyl, aryloxy, arylthio, arylsulfoxy or arylsulfonyl each of which has up to 6 C atoms.

Examples of preferred radicals $R^1$ and $R^2$ are methyl, ethyl, n-propyl, iso-propyl, cyclohexyl, phenyl, benzyl, pyridyl, naphthyl, tolyl, anisyl, 2,4,6-trimethylphenyl, 4-isopropylphenyl, chlorophenyl, bromophenyl and nitrophenyl.

In principle, the compounds of the formula I can all be prepared by processes such as have already been described in the literature for 1,2-disulfones. According to German Patent Application No. P 3,804,316, the oxidation of 1,2-disulfonylhydrazines, which are readily accessible by reacting hydrazine with sulfonic acid chlorides, by means of concentrated nitric acid as oxidizing agent to give the 1,2-disulfones of the formula I has proved itself a chosen process of synthesis. This synthesis route is very simple, gives good yields and makes possible access to virtually any desired combinations of the substituents $R^1$ and $R^2$.

It is preferable to employ, as photoinitiators in the negative photoresists according to the invention of the polyimide type, symmetrical, and especially unsymmetrical, 1,2-disulfone compounds of the formula I in which $R^1$ and $R^2$ are phenyl, phenyl substituted by methyl, methoxy or isopropyl, or $C_1$–$C_3$alkyl. Examples of such compounds which should be singled out in particular are 1,2-diphenyl disulfone, 1-(4-methylphenyl) 2-phenyl disulfone, 1-(4-methoxyphenyl) 2-phenyl disulphone, 1-(4-isopropylphenyl) 2-phenyl disulfone, 1-(4-methylphenyl) 2-methyl disulfone, 1,2-di-n-propyl disulfone and 1-(4-methoxyphenyl) 2-n-propyl disulfone.

Depending on the nature of the substituents $R^1$ and $R^2$, the compounds of the formula I can be employed as photoinitiators within a wavelength range from about 200 to 450 nm. Compounds of the formula I in which the substituents $R^1$ and $R^2$ are phenyl or phenyl containing few substituents are particularly effective chiefly within the low to medium UV range, say between 200 and 280 nm. By adding co-sensitizers of a known type which absorb in regions of longer wavelength, for instance aromatic ketones, such as Michler's ketone, the sensitivity of the negative photoresists according to the invention can, if required, be shifted into the near UV range. An initiator action which is adequate for practical use results from the compounds of the formula I if they are present in the negative photoresists according to the invention of the polyimide type in a proportion of 0.1 to 20% by weight, preferably 1 to 10% by weight, relative to the total solids content of the photoresist solution.

In the negative photoresists according to the invention of the polyimide type the layer-forming component is essentially a prepolymer a polyamide-acid or polyamide-acid derivative which can be converted into a highly heat-resistant polyimide polymer or polymer related to polyimide. In principle, all known prepolymers of this type, such as have been described many times, for instance, in the publications quoted initially, are suitable for this. Very generally, they are polycondensation or polyaddition products of tetrafunctional aromatic compounds containing two functional groups capable of polycondensation or polyaddition reactions and two carboxyl groups or groups of carboxyl derivatives adjacent to the latter, with difunctional aromatic compounds, such as aromatic diamines, diisocyanates, dicarboxylic acids or biscarbonyl chlorides which can react correspondingly. The resulting polyamide prepolymers are mainly derived from mononuclear or dinuclear tetracarboxylic acids and from mononuclear or dinuclear diamines. The parent tetracarboxylic acids are preferably pyromellitic acid or 3,3',4,4'-benzophenonetetracarboxylic acid; the parent diamines are preferably 4,4'-diaminodiphenyl ether, 4,4'-diaminodiphenylmethane and 4,4'-diaminodiphenyl sulfone. Prepolymers based on pyromellitic acid or 3,3',4,4'-benzophenonetetracarboxylic acid and 4,4'-diaminodiphenyl ether are very particularly preferred. These prepolymers can be prepared in a simple manner, as described, for instance, in the publications quoted initially, by reacting equimolar amounts of the dianhydrides of the parent tetracarboxylic acids with the corresponding diamines. If the two carboxylic acid radicals which, per tetracarboxylic acid unit, are not required in each case for the polyamide bond are not reacted previously or in the further course of the process, the result is polyamide acid prepolymers. If these carboxylic acid radicals are additionally subjected to a reaction, for example for the formation of corresponding salts, carboxylic acid esters or carboxamides, the corresponding polyamide-acid derivative prepolymers result. Suitable salts in such cases are principally the alkali metal and ammonium salts and especially salts with tertiary aliphatic amines or substituted amines which may also be unsaturated, for example salts of trimethylamine, triethylamine or 2-(N,N-dimethylamino)-ethyl methacrylate. Polyamide-acid esters are principally the esters of lower aliphatic alcohols, such as methanol and ethanol; they can also be the unsaturated esters of glycol monoallyl ether or 2-hydroxyethyl methacrylate, which are known from German Patent Specification No. 2,437,348. The free carboxylic acid groups of the polyamide-acid prepolymers can form derivatives with aliphatic amines, such as, for instance, methylamine or ethylamine, or unsaturated amines, such as 2-aminoethyl methacrylate, to give the corresponding acid amides. Compounds which are particularly preferred as layer-forming components for the negative photoresists according to the invention of the polyimide type are the polyamide-acids which can be prepared from pyromellitic dianhydride or 3,3',4,4'-benzophenonetetracarboxylic dianhydride and 4,4'-diaminodiphenyl ether, the methyl, ethyl and methacryloyloxyethyl esters thereof and salts thereof with 2-(N,N-dimethylamino)-ethyl methacrylate.

The polyamide-acid or polyamide-acid derivative prepolymers to be employed in the negative photoresists according to the invention of the polyimide type can have molecular weights which vary within a wide range. The essential requirement is only that they are adequately soluble in customary solvents and, on coating, form a dry, solid layer after the solvent has evaporated. The molecular weights are preferably within the range between 5,000 and 100,000, in particular between 10,000 and 30,000. In the photoresists according to the invention, the prepolymer is usually present in a proportion of 50-95% by weight, preferably 70-90% by weight, relative to the total content of the photoresist solution.

Suitable solvents for the preparation of the photoresist solution are, in principle, any solvents in which the solid photoresist constituents, such as prepolymer, compound(s) of the formula I and, if appropriate, further additives are adequately soluble and which do not react irreversibly with these constituents. Examples of solvents suitable for this purpose are aprotic, polar solvents, such as dimethylformamide, dimethylacetamide, N-methylpyrrolidone, hexamethylphosphoric triamide and butyrolactone, aliphatic ketones, such as methyl ethyl ketone, cyclopentanone or cyclohexanone, aliphatic esters, such as ethyl acetate or butyl acetate, ethers, such as dioxane or tetrahydrofuran, monoethers or bisethers and ether and ester derivatives of glycol compounds, such as ethylene glycol monomethyl ether, ethylene glycol dimethyl ether, ethoxyethyl acetate or methoxypropyl acetate and also monooxycarboxylic acid esters, such as ethyl lactate or ethyl 2-ethoxypropionate. Mixtures of the said solvents are also frequently used. The photoresists according to the invention preferably contain N-methylpyrrolidone and cyclopentanone as solvents. The content of solvent is usually 40-90% by weight of the total photoresist solution.

Negative photoresists of the polyimide type which contain, as photoinitiators, only prepolymers, in particular also prepolymers without photopolymerizable groups, and 1,2-disulfones of the formula I are already fully operative and can be employed for practical application. For adaptation to the requirements of the particular end use, these photoresists can also be further modified by means of additives customary in this technology and can, for example, be optimized in respect of spectral sensitivity, self-absorption, minimum exposure energy, achieveable image resolution and edge sharpness and coating and developing properties.

Modifying additives which can be present in the photoresists according to the invention are sensitizers for spectral sensitization, such as are known in large numbers from the relevant state of the art. Preferably, aryl ketone sensitizers, such as benzophenone, 4,4'-bis-(dimethylamino)benzophenone (Michler's ketone) or 4,4'-bis-(diethylamino)-benzophenone are present In order to increase their sensitivity, the photoresists according to the invention of the polyimide type can additionally also contain photopolymerizable unsaturated components analogously to the known photoresists of this type. These can be monofunctional, difunctional or polyfunctional acrylic or allyl compounds, especially acrylic and allyl esters or acrylic and allyl ethers of aliphatic, cycloaliphatic or aromatic polyhydroxy compounds, as well as vinyl compounds, such as vinyl ether, vinyl thioether or vinyl sulfone compounds. Examples of photopolymerizable unsaturated compounds which may be mentioned are acrylic compounds, such as trimethylolpropane triacrylate or trimethacrylate, ethoxylated trimethylolpropane triacrylate or pentaerythritol triacrylate or trimethacrylate; mono- and di-acrylates or -methacrylates of ethylene glycol or diethylene, triethylene and tetraethylene glycol, such as, for instance, ethylene glycol monoacrylate, triethylene glycol dimethacrylate, tetraethylene glycol monoacrylate or tetraethylene glycol dimethacrylate; allyl ethers, such as trimethylolpropane triallyl ether and pentaerythritol triallyl ether; and vinyl compounds, such as 2-hydroxyethyl vinyl ether and 2-hydroxyethyl vinyl sulfone. The photoresists according to the invention can contain 0–35% by weight, preferably 5–15% by weight, of such photopolymerizable unsaturated components, relative to the total solids content of the photoresist solution.

The photoresists according to the invention can also contain, in addition, dyes by means of which it is also possible, firstly, to control the spectral sensitivity and which, secondly, are used particularly to suppress undesirable scattered radiation effects. Preferred dyes in this respect in leuko dyes of the type of the triarylmethanes, such as are known from the relevant state of the art. Dyes of this type can be present in a proportion of 0.1–5% by weight, preferably 0.5–2.5% by weight, relative to the total solids content of the photoresist solution.

The further customary additives which can, if appropriate, also be present in the negative photoresists according to the invention of the polyimide type include adhesion promoters, flow control agents, plasticizers, further film-forming resins, surfactants and stabilizers. Additives in this category are adequately known to those skilled in the art and have been described many times in the relevant specialist literature. The content of such additives, taken together, hardly exceeds 25% by weight, relative to the total solids content of the photoresist solution.

The formulation of the photoresists according to the invention is effected in a manner known per se by mixing or dissolving the components in the solvent or solvent mixture. After the constituents have been dissolved in the solvent, the resulting photoresist solution is filtered through membrane filters having a pore width of 0.1–1 μm, depending on the demand for freedom from particles. Usually the total solids content of the photoresist is adjusted to suit the desired layer thickness and method of coating.

Application is effected by a process known per se and using the process equipment customary for this, by coating a substrate with the photoresist solution, drying the layer at an elevated temperature, exposing the layer image-wise to radiation of a wavelength range in which the layer is sensitive, developing by dissolving away the non-irradiated portions of the layer and heat-treating the resulting relief structures.

The substrates mainly used are semiconductor wafers, for example silicon wafers, which have, if appropriate, been coated with a layer of silicon dioxide, silicon nitride or aluminium. Other materials customary in the production of miniaturized circuits, such as germanium, gallium arsenide or ceramics with or without a coating of noble metal, are also suitable.

Coating is usually effected by dipping, spraying, rolling or whirler-coating. In the latter method of coating, which is the most frequently used, the resulting layer thickness depends on the viscosity of the photoresist solution, the solids content and the speed of the whirler-coater. So-called whirler curves are determined for each particular photoresist, and the resist layer thicknesses can be determined from these curves as a function of the viscosity and the speed of rotation of the whirler. The photoresists according to the invention can be employed with advantage to produce layers and relief structures having layer thicknesses between 0.1 and 500 μm. Thin layers, for instance when used as temporary photoresists or as an insulating layer or dielectric in multilayer circuits are typically between 0.1 and 5 μm, especially 1–2 μm. Thick layers, for instance when used as a passivating layer or protection against α-radiation in semiconductor storage elements, are typically between 10 and 200 μm, especially 20–100 μm.

After the photoresist has been applied to the substrate, it is normally subjected to preliminary drying at temperatures between 50° and 120° C. Ovens or hotplates can be used for this purpose. The drying time in ovens is within the range of about 10–60 minutes, but can also be several hours in the case of thick layers. The drying time on hotplates is normally within the range of about 0.5–5 minutes.

The photoresist layer is then exposed to the radiation which causes the reaction of the radiation-reactive constituents with crosslinking of the layer. Actinic light is customarily used, but high-energy radiation, such as X-rays or electron beams, can also be used. The irradiation or exposure can be carried out through a mask pattern, but a concentrated beam of the radiation can also be lead over the surface of the photoresist layer. UV lamps emitting radiation of a wavelength of 200–500 nm, preferably 300–400 nm, are customarily used for irradiation. Exposure can be carried out with polychromatic or monochromatic light. Commercially available exposure equipment, for example contact and distance exposure equipment, scanning projection exposure equipment or wafer steppers, is preferably used for this purpose.

After the exposure a pattern can then be developed by baring parts of the substrate by treating the layer with a developer solution which removes the non-irradiated areas of the photoresist layer. The developers used are, as a rule, the solvents customary for the preparation of the photoresist solution, if appropriate a mixture of these. Mixtures of a solvent and a non-solvent are also frequently employed as the developer. Non-solvents in this context are alcohols, such as methanol, ethanol and isopropanol, and aromatic hydrocarbons, such as toluene and xylene. Examples of a typical developer mixture are 4-butyrolactone/toluene, dimethylformamide/ethanol, methyl ethyl ketone/methanol or cyclopentanone/isopropanol, in each case in a ratio of 2:1 to 1:4. Developers which are particularly preferred for the photoresists according to the invention are cyclopentanone and cyclopentanone/isopropanol. The development times depend on the energy of exposure, the strength of the developer, the mode of development, the preliminary drying temperature and the developer temperature. Development times of 10–30 seconds are typical for spray development or of about 1–2 minutes for immersion development. Development is usually stopped by immersion or spraying with a non-solvent.

The negative photoresists according to the invention of the polyimide type make it possible to obtain polymer coatings and relief structures of sharp edges having layer thicknesses between 0.1 and 500 μm, image definition being possible down to about 1 μm, depending on the layer thickness. The polyamide-acid or polyamide-acid derivative prepolymer, which forms the essential part of the photoresist layer or photoresist relief structure, is converted by thermal imidation into polyimide by heat-treatment at a temperature between about 200° and 400° C. The loss in layer thickness during heat treatment is moderate to low, depending on the content of volatile components. In the case of photoresists according to the invention, containing only polyamide-acid prepolymer and 1,2-disulfone photoinitiator, virtually no loss in layer thickness can be recorded during heat treatment. As a result of their content of 1,2-disulfone photoinitiators, the negative photoresists according to the invention of the polyimide type can be structured in the wavelength range between 200 and 450 nm and can be processed without problems under yellow safety illumination. They are stable on storage for a prolonged period; because of the stability of the 1,2-disulfones a decrease in the sensitivity to radiation cannot be recorded even on prolonged storage. In addition, the 1,2-disulfone photoinitiators employed are in no way an explosion hazard and they contain, as a rule, no ingredients incompatible with semiconductor materials. The special value of the photoresists according to the invention for practical application resides precisely in these properties.

EXAMPLES

A. General instructions for the preparation of 1,2-disulfones of the formula $R^1-SO_2-SO_2-R^2$ (I)

Concentrated nitric acid (density 1.4) is added dropwise, with stirring and cooling in ice, to the appropriate 1,2-disulfonyl hydrazine compound. The reaction starts, with evolution of nitrogen, after a few minutes. When the reaction has subsided, the mixture is stirred for about 1 hour more at 0° C. and the precipitate which has been deposited is removed and purified by recrystallization.

B. Compounds prepared

| No. | $R^1$ | $R^2$ | Recrystallized from | Melting point (°C.) |
|---|---|---|---|---|
| 1 | phenyl | phenyl | ethanol | 192 |
| 2 | phenyl | 4-methyl-phenyl | methanol | 177 |
| 3 | phenyl | 4-methoxy-phenyl | acetone | 153 |
| 4 | phenyl | 2-naphthyl | methyl t-butyl ether | 182 |
| 5 | phenyl | benzyl | methyl t-butyl ether/acetone | 186 |
| 6* | phenyl | 2-nitro-3,5-dimethoxy-phenyl | acetone | 186 |
| 7 | phenyl | 2,4,6-tri-methyl-phenyl | toluene | 154 |
| 8 | phenyl | 4-isopropyl-phenyl | glacial acetic acid | 92 |
| 9 | phenyl | 4-chloro-phenyl | toluene | 181 |
| 10 | phenyl | 4-bromo-phenyl | acetone | 198 |
| 11 | 4-methylphenyl | 4-methyl-phenyl | acetone/ether | 222 |
| 12 | 4-methylphenyl | 4-chloro-phenyl | toluene | 206 |
| 13 | 4-methylphenyl | benzyl | methanol | 126 |
| 14 | 4-methylphenyl | 2-naphthyl | methyl t-butyl ether/dichloro-methane | 186 |
| 15 | 4-methylphenyl | 4-methoxy-phenyl | acetone | 173 |
| 16* | 4-methylphenyl | 2-nitro-3,5-dimethoxy-phenyl | acetone | 182 |
| 17 | 4-methylphenyl | methyl | methyl t-butyl ether | 109 |
| 18 | 4-methylphenyl | 1-naphthyl | acetone | 201 |
| 19 | 1-naphthyl | 1-naphthyl | acetone/DMF | 183 (decomposition) |
| 20 | 2-naphthyl | 2-naphthyl | THF | 226 (decomposition) |
| 21 | 4-methoxy-phenyl | 4-methoxy-phenyl | acetone | 194 (decomposition) |
| 22 | 4-nitrophenyl | 4-nitro-phenyl | THF | 224 (decomposition) |
| 23 | 2-methylphenyl | 2-methyl-phenyl | toluene | 160 |
| 24 | benzyl | benzyl | glacial acetic acid | 183 (decomposition) |
| 25 | benzyl | n-propyl | dichloromethane/n-pentane | 100 |
| 26 | n-propyl | n-propyl | (water)** | 53 |
| 27 | n-propyl | 4-nitro-phenyl | methyl t-butyl ether | 111 |
| 28 | n-propyl | 4-methoxy-phenyl | petroleum ether | 83 |
| 29 | phenyl | n-propyl | methyl t-butyl-ether | 138 |
| 30 | phenyl | 4-t-butyl-phenyl | (water)** | 128 |
| 31 | 4-methylphenyl | n-propyl | (water)** | 86 |
| 32 | 4-i-propyl-phenyl | methyl | — | (Oel) |
| 33 | 4-t-butyl-phenyl | n-propyl | ether/petroleum ether | 110 |
| 34 | 1-naphthyl | methyl | toluene | 157 |
| 35 | 1-naphthyl | n-propyl | (water)** | 116 |
| 36 | 2-naphthyl | methyl | (water)** | 146 |
| 37 | 2-naphthyl | n-propyl | ether/petroleum ether | 67 |
| 38 | 4-acetylamido-phenyl | n-propyl | glacial acetic acid | 89 |
| 39 | 4-acetylamido-phenyl | phenyl | glacial acetic acid | 208 |
| 40 | 4-acetylamido- | 4-methyl- | glacial acetic acid | 201 |

-continued

B. Compounds prepared

| No. | R¹ | R² | Recrystallized from | Melting point (°C.) |
|---|---|---|---|---|
| 41 | 4-acetylamido-phenyl | phenyl 4-methoxy-phenyl | glacial acetic acid | 204 |
| 42 | 4-acetylamido-phenyl | 4-nitro-phenyl | glacial acetic acid | 198 (decomposition) |
| 43 | 4-phthalimido-phenyl | n-propyl | glacial acetic acid | 196 |
| 44 | 4-phthalimido-phenyl | phenyl | dichloromethane/cyclohexane | 210 |
| 45 | 4-phthalimido-phenyl | 4-methyl-phenyl | glacial acetic acid | 214 |
| 46 | 4-phthalimido-phenyl | 4-methoxy-phenyl | glacial acetic acid | 162 |
| 47 | 4-(1,2-Dimethylmalein-imido)phenyl | n-propyl | methyl t-butyl ether | 143 |
| 48 | 4-(1,2-Dimethylmalein-imido)phenyl | phenyl | dichloromethane | 222 |
| 49 | 4-(1,2-Dimethylmalein-imido)phenyl | 4-methyl-phenyl | dichloromethane petroleum ether | 235 |
| 50 | 4-(1,2-Dimethylmalein-imido)phenyl | 4-methoxy-phenyl | glacial acetic acid | 62 |
| 51 | 4-nitrophenyl | n-propyl | ether | 104 |

*The NO₂ group was introduced here during the nitric acid oxidation.
**Crystallizes out in adequate purity merely when water is added.

C. Preparation and use of photoresists

In the following Examples the photoresist solutions were prepared, unless otherwise indicated therein, by mixing the components indicated and then subjecting the mixture to fine filtration.

The photoresist formulations were whirler-coated at a speed of rotation of about 5000 r.p.m. onto surface-oxidized silicon wafers of diameter 4" and were dried in a circulating air oven at 65° C. or on a hotplate at 100° C.

Exposure was carried out with polychromatic light (equipment: Süss MJB 55; ultra-high pressure Hg lamp) through a resolution test mask containing structures (trenches and ridges) between 2 and 100 μm in vacuum contact with additional nitrogen blanketing, the energy of exposure at 365 nm being recorded by means of a measuring probe.

Development was carried out by the spraying process using a mixture of equal parts of cyclopentanone and isopropanol and stopping by means of isopropanol.

EXAMPLE 1

| Composition: | |
|---|---|
| Polyamide-acid solution PI 2555 (Dupont) (Polycondensate formed from benzophenonetetracarboxylic dianhydride and 4,4'-diaminodiphenyl ether; 15% solution) | 10.0 g |
| 1-(4'-Isopropylphenyl) 2-phenyl disulfone (Compound no. 8) | 0.5 g |
| 4,4'-bis-(diethylamino)-benzophenone | 0.25 g |
| N-methylpyrrolidone | 2.0 g |

At an exposure energy of 2700 mJ/cm² and a resulting layer thickness of 1.1 μm, all the mask structures were reproduced with good image definition and sharp edges.

EXAMPLE 2

Comparison test

Using the same formulation, but without 1,2-disulfone photoinitiator, no structuring was possible under the same conditions.

EXAMPLE 3

| Composition: | |
|---|---|
| Polyamide-ester prepolymer (Polycondensate formed from pyromellitic dianhydride, 4,4'-diaminodiphenyl ether and 2-hydroxyethyl methacrylate as specified in German Patent 2,437,348) | 35.0 g |
| Tetraethylene glycol diacrylate | 7.0 g |
| 1,2-Diphenyl disulfone (Compound no. 1) | 2.0 g |
| 4,4'-Bis-(diethylamino)-benzophenone | 1.0 g |
| N-Methylpyrrolidone | 27.0 g |
| Cyclopentanone | 27.0 g |

At an exposure energy of 65 mJ/cm² and a layer thickness of 4.5 μm, all the mask structures are reproduced with good image definition and sharp edges down to a magnitude of 4 μm.

After heat treatment (30 minutes heating up to 250° C./30 minutes at 250° C./30 minutes heating up to 400° C.), the relief structures which have been converted into polyimide have a layer thickness of 2.2 μm with no loss of resolution and edge sharpness.

EXAMPLES 4–16

The procedure is as in Example 3, but using corresponding compositions containing other 1,2-disulfone photoinitiators.

At the exposure energies indicated structures having dimensions equal to or larger than the respective layer thickness were reproduced with good image definition and sharp edges.

| 1,2-Disulfone compound no. | Layer thickness (μm) | Exposure energy (mJ/cm²) |
|---|---|---|
| 2 | 4.1 | 82 |
| 3 | 3.6 | 90 |
| 4 | 5.4 | 135 |
| 5 | 5.6 | 224 |
| 7 | 4.7 | 94 |
| 9 | 4.9 | 98 |
| 11 | 4.6 | 138 |
| 15 | 4.8 | 120 |
| 17 | 5.1 | 117 |
| 23 | 4.6 | 92 |
| 28 | 5.2 | 208 |
| 36 | 4.8 | 96 |
| 41 | 4.7 | 140 |

EXAMPLE 17

| Composition: | |
|---|---|
| Polyamide-ester prepolymer (As in Example 3) | 41.0 g |
| Tetraethylene glycol diacrylate | 8.0 g |
| 1,2-Diphenyl disulfone (Compound no. 1) | 2.0 g |
| Michler's ketone | 1.0 g |
| N-methylpyrrolidone | 47.0 g |

In order to prepare a thick layer whirler-coating was carried out at a speed of rotation of only 1000 r.p.m. and the coating was dried in an oven at 65° C. for 3.5 hours.

At an exposure energy of 750 mJ/cm² and a layer thickness of 30 μm, mask structures extending to 20 μm are reproduced with good image definition and sharp edges.

After heat treatment (1.5 hours heating up to 400° C./1 hour at 400° C.), the structures which have been converted into polyimide have a layer thickness of 18 μm with no loss of resolution or edge sharpness.

EXAMPLE 18

| Composition: | |
|---|---|
| Polyamide-acid solution PI 2555 (as in Example 1) | 10.0 g |
| 2-(N,N-Dimethylamino)-ethyl methacrylate | 1.0 g |
| Michler's ketone | 0.05 g |
| 1-(4-Methylphenyl) 2-phenyl disulfone | 0.03 g |
| N-Methylpyrrolidone | |

Drying: 30 Minutes at 65° C. in an oven.
Developing: 2 Minutes immersion development in 3:1 N-methylpyrrolidone/methanol.

At an exposure energy of 105 mJ/cm² and a layer thickness of 3.5 μm, structures extending to 7 μm were resolved with sharp edges.

EXAMPLE 19

Composition: As in Example 3, but the prepolymer was a polycondensate formed from 3,3',4,4'-benzophenonetetracarboxylic acid, 4,4'-diaminodiphenyl ether and 2-hydroxyethyl methacrylate.

At an exposure energy of 90 mJ/cm² and a layer thickness of 6.1 μm, structures extending to 4 μm are resolved with good image definition and sharp edges.

What is claimed is:

1. A negative photoresist of the polyimide type consisting essentially of, in an organic solvent, at least
   (a) one prepolymer of a polyamide-acid or polyamide-acid derivative which can be converted into a highly heat-resistant polyimide polymer,
   (b) a photoinitiator corresponding to the formula $$R^1-SO_2-SO_2-R^2 \qquad (I)$$

in which $R^1$ and $R^2$ can be identical or different and are alkyl, cycloalkyl, aryl, aralkyl or heteroaryl having up to 12 C atoms and being unsubstituted or monosubstituted or polysubstituted by halogen, cyano, nitro, alkyl, alkoxy, alkylthio, monoalkylamino, bisalkylamino, alkanoyl, acyloxy, acylamido, alkoxycarbonyl, alkylaminocarbonyl, alkylsulfoxy, alkylsulfonyl, aryloxy, arylthio, arylsulfoxy or arylsulfonyl each of which has up to 6 C atoms; said photoresist containing no photopolymerizable unsaturated components.

2. A negative photoresist according to claim 1 which contains 0.1 to 20% by weight, of a compound of the formula I.

3. The negative photoresist of claim 2 which contains 1–10%, by weight, of a compound of the formula I.

* * * * *